US008761210B1

(12) United States Patent
Henry et al.

(10) Patent No.: US 8,761,210 B1
(45) Date of Patent: Jun. 24, 2014

(54) GENERATING NARROW LINEWIDTH 1178 NM LASER OUTPUT USING A SEEDED RAMAN AMPLIFIER

(71) Applicants: Leanne J. Henry, Albuquerque, NM (US); Thomas M. Shay, Saint George, UT (US); Gerald T. Moore, Albuquerque, NM (US); Jacob R. Grosek, Albuquerque, NM (US)

(72) Inventors: Leanne J. Henry, Albuquerque, NM (US); Thomas M. Shay, Saint George, UT (US); Gerald T. Moore, Albuquerque, NM (US); Jacob R. Grosek, Albuquerque, NM (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 13/917,559

(22) Filed: Jun. 13, 2013

Related U.S. Application Data

(62) Division of application No. 13/211,385, filed on Aug. 17, 2011, now Pat. No. 8,472,486.

(51) Int. Cl.
*H01S 3/30* (2006.01)
(52) U.S. Cl.
USPC .................................................. 372/3; 372/6
(58) Field of Classification Search
CPC ... H01S 3/302; H01S 3/0675; H01S 3/06754; H01S 3/0826; H01S 3/10092; H01S 3/1055; H01S 3/1053
USPC ......................................................... 372/3, 6
See application file for complete search history.

(56) References Cited

U.S. PATENT DOCUMENTS

| 6,721,088 | B2 * | 4/2004 | Brar et al. ................... 359/334 |
| 6,731,426 | B2 * | 5/2004 | Yeniay et al. ............ 359/341.32 |
| 6,996,135 | B2 * | 2/2006 | Martinelli et al. ................ 372/3 |
| 7,764,720 | B1 * | 7/2010 | Bronder et al. ................... 372/6 |
| 2006/0198397 | A1 * | 9/2006 | Korolev et al. ................... 372/3 |
| 2009/0296743 | A1 * | 12/2009 | Islam ............................... 372/3 |
| 2010/0284061 | A1 * | 11/2010 | Nicholson ..................... 359/334 |
| 2010/0290106 | A1 * | 11/2010 | DiGiovanni et al. ......... 359/334 |

FOREIGN PATENT DOCUMENTS

JP WO01/65647 A3 * 9/2001 ............... H01S 3/30

* cited by examiner

*Primary Examiner* — Yuanda Zhang
(74) *Attorney, Agent, or Firm* — James M. Skorich

(57) ABSTRACT

A broad linewidth, zeroth Stokes order 1069 nm pump and a narrow linewidth second Stokes order 1178 nm seed propagate through a wavelength division multiplexer and then through a rare-earth-doped amplifier. After passing through a 1121 nm long period or tilted Bragg grating, the amplified 1069 nm Stokes signal and the 1178 Stokes signal are injected into a 1121 nm resonator Raman cavity, which includes a pair of highly reflective Bragg gratings having a center wavelength of 1121 nm. The amplified 1069 nm Stokes signal is Raman converted to high power levels of 1121 nm which then, in turn, amplifies the 1178 nm Stokes seed as it traverses the cavity. The linewidth of the amplified 1178 nm Stokes signal can be controlled by offsetting, through heating, the reflectivity bandwidth of the Bragg grating located near the output end of the Raman cavity.

26 Claims, 9 Drawing Sheets

Sodium Guidestar Laser System

Configuration with Nested Raman Resonators

Configuration with non-nested Raman Resonators

Sodium Guidestar Laser System

GENERATING NARROW LINEWIDTH 1178 NM LASER OUTPUT USING A SEEDED RAMAN AMPLIFIER

CROSS-REFERENCE TO RELATED APPLICATION

This application is a divisional application of U.S. patent application Ser. No. 31/211,385 filed on Aug. 17, 2011, which issued as U.S. Pat. No. 8,472,486, and claims the benefit of the foregoing filing date.

STATEMENT OF GOVERNMENT INTEREST

The conditions under which this invention was made are such as to entitle the Government of the United States under paragraph 1(a) of Executive Order 10096, as represented by the Secretary of the Air Force, to the entire right, title and interest therein, including foreign rights.

FIELD OF THE INVENTION

The invention relates generally to high-power Raman amplifier systems having linewidths from narrow to broad, functioning in the near-infrared spectral region for numerous applications. Such applications include a narrow linewidth 1178 nm sodium guidestar laser for improved space situational awareness, a 1240 nm source for remote sensing of water, and 1300-1500 nm lasers for telecommunications.

BACKGROUND OF THE INVENTION

In general, there is a lack of efficient, high-power lasers in the 1100-1500 nm region with a controllable linewidth. Lasers in the 1100-1500 nm spectral region are difficult to obtain, since many materials don't lase in this region and those that do lase in parts of the spectral region such as bismuth co-doped silica or Yb-doped silica, do so inefficiently. One way of obtaining photons in this spectral region is through the nonlinear process of Stimulated Raman Scattering which acts to shift the initial pump wavelength out to longer wavelengths. This process, which occurs at high optical intensities, involves the coupling of light propagating through the non-linear medium to the vibrational modes of the medium. The result is re-radiated light which is shifted to a different wavelength. Light upshifted in wavelength is commonly referred to as a Stokes line, whereas light downshifted in wavelength is referred to as an anti-Stokes line. To-date, a controllable linewidth, high-power Raman laser with output powers approaching 100 W has not been reported.

The typical Raman amplifier tends to be in several forms. The first form is seeded with an initial pump signal of relatively low power (zeroth order Stokes line) that is free-space coupled or spliced into the system. Multiple orders of Stokes lines are then created in one or more Raman resonators. Each Raman resonator in the system is defined by a pair of Bragg gratings centered at the wavelength of the Stokes order involved. The output of one Raman resonator is injected into the Raman resonator centered at the next highest Stokes order. The highest order Stokes line generated is the output of the laser. Such amplifiers typically tend to have low Raman conversion efficiencies and low output powers (<5 W) due to the relatively low intensity of injected pump signal in the core. Raman fibers hundreds of meters in length are often required to enable adequate conversion of the pump signal to a longer wavelength. Such lasers also tend to have broad linewidths, since the Raman process is initiated by broadband spontaneous Raman scattering within the fiber. It has also been observed that, as the power in the system is increased and/or higher-order Stokes lines are generated, the linewidth of the output tends to further broaden. To conclude, this type of Raman laser tends to have low output powers in addition to linewidths, which are not controlled and are broad.

A variant of the above are all-fiber Raman systems where the pump is either generated or amplified by a rare-earth amplifier that is spliced directly onto the Raman resonators (Nicholson, US Patent Application No. 2010/0284060A1 and Nicholson, et al., Optics Letters 35(18)(2010) 3069). This type of system has the potential of generating high output powers (>50 W) because of direct injection of high power levels of the zeroth order Stokes directly into the core of the fiber via an amplifier. Highest power levels were achieved by Nicholson et al., who demonstrated 81 W of output power at 1480 nm when 162 W of 1117 nm pump from an amplifier was injected into 120 m of Raman filter fiber. Although high power levels were achieved, a long length of Raman fiber was still required in order to enable sufficient buildup in the Raman cavities of the various Stokes lines from spontaneous Raman scattering. The resultant linewidth of these lasers is broad, since no measures are taken to control linewidth broadening. To conclude, this kind of laser is capable of high output powers but the linewidths tend to be broad.

Another variant of a Raman amplifier involves both seeding with the desired output signal ($N^{th}$ order Stokes) and a pump signal (zeroth order Stokes) through either a wavelength division multiplexer (WDM) or an optical circulator (see for example, Taylor et al., US Patent Application No. 2011/0038035A1). In such systems, one or more stages of Raman amplification may be necessary in order to generate the $N-1^{th}$ order Stokes signal necessary for amplification of the $N^{th}$ order Stokes seed. Because both WDMs and optical circulators are power limited, the amount of pump signal (zeroth order Stokes) and desired output signal ($N^{th}$ order Stokes) that can be fed into the system is limited. Because of low levels of pump signal in the system, output power levels are limited, efficiencies tend to be low, and extremely long Raman fibers (100 m or more) are necessary. Output power levels are also limited by Stimulated Brillouin Scattering for narrow linewidth signals due to the long Raman fiber. Relative to an unseeded system, the linewidth of the amplified output signal is controllable to a certain degree, since the seed signal will dominate the spontaneous Raman scattering. Even so, linewidth broadening will still occur because of four-wave mixing. To conclude, this sort of system is capable of lower output powers with some control of the linewidth.

Another variant is to seed a system with power from a rare-earth-doped oscillator that is spliced directly onto a Raman resonator (Mead, US Patent Application No. 2011/0122482). In this patent application, the main focus is on generating closely spaced wavelengths from multiple Raman fiber amplifiers through stretching of fiber to enable spectral beam combination of eye-safe lasers. One embodiment is shown where the system is seeded with the desired output wavelength ($N^{th}$ order Stokes) and is Q-switched to generate pulsed light. No continuous wave configuration is discussed. The rare-earth-doped oscillator, which is unseeded, is co- and counter-pumped with diodes. The output wavelength of the oscillator is determined by the Bragg gratings that form the cavity and will have a broad linewidth, since it is seeded with amplified spontaneous emission. The rare-earth-doped oscillator/Raman resonator described in this embodiment should be capable of high output power because of direct injection of the zeroth order Stokes from the rare-earth-doped oscillator into the core of the fiber in the Raman resonators but, once again, the $N^{th}$ order Stokes seed will experience linewidth broadening as it is amplified since no measures are taken to mitigate four-wave mixing. This configuration will also be power limited relative to what would be achievable using a comparable rare-earth-doped amplifier because of thermal issues associated with power buildup in the cavity of the rare-earth-doped oscillator. Also, for high-power applications, fully nested Raman cavities as they appear in this patent application will experience higher thermal stresses than a less overlapped configuration. In addition, the embodiment in this patent application may experience damage upstream, since no measures are taken to mitigate light leaking out of the gratings and propagating backwards. To conclude, the system described will be capable of high-power output pulses (but not continuous wave operation), but because no measures are taken to control four-wave mixing, broadening of the signal linewidth will occur. Also, high power levels within the rare-earth-doped oscillator and the Raman cavities may be a limiting issue.

An important narrow-linewidth application for Raman lasers is the generation of 1178 nm for guide star (e.g., sodium guidestar) laser applications. This is important since the resolution of terrestrial telescopes is limited by wave front distortion caused by atmospheric turbulence. This distortion can largely be overcome by the use of adaptive optics in which the surface of a deformable telescope mirror is varied as a function of time to compensate for atmospheric turbulence through which light from distant objects must travel. Measuring the distortion requires that there be a bright optical source in the sky, such as a bright star, located close to the object to be observed. Since bright stars are infrequently located close to objects of interest. An alternative is to energize a layer of sodium atoms which is naturally present in the mesosphere at an altitude of around 90 kilometers. The sodium atoms then re-emit the laser light, producing a glowing artificial star whose radiation can provide a wavefront reference to enable correction of the image for atmospheric induced aberrations.

The sodium guidestar laser application is very challenging in that output powers on the order of 50 W of 589.15908 nm on the sodium $D_{2a}$ line with a linewidth of 10 MHz is required. For two-line system, an additional 10 W of 589.15709 nm on the sodium D2B line with a linewidth of 10 MHz is desired. One very successful method for generating 50 W of 10 MHz linewidth 589 nm involves the use of traditional rod laser technology and sum-frequency generation via a nonlinear crystal. A state-of-the-art system developed at the Air Force Research Laboratory (Denman, et. al., U.S. Pat. No. 7,035,297) contains 1064 and 1319 nm resonant cavities in addition to a doubly resonant sum-frequency generation cavity containing a lithium triborate crystal. To maintain lock on the $D_{2a}$ line of sodium, multiple Pound-Drever-Hall locking loops are utilized. A maximum of 50 W of 589 nm was achieved by this system. The major drawback associated with this system is its size and complexity.

The most successful attempt at addressing the requirement for the sodium guidestar laser using fiber was accomplished by the European Southern Observatory (ESO) (Feng, et. al., Optics Express 17(21)(2009) 19021). In this concept, a Raman amplifier is directly core pumped with 1121 nm in a counter-pumped configuration while being seeded with narrow linewidth 1178 nm through a wavelength division multiplexer (WDM). The amount of narrow linewidth 1178 nm that can be generated was limited to less than 39 W. Coherent beam combination has been used to generate 26 W of 589 nm from two 1178 nm sources and greater than 50 W from three Raman fiber amplifiers. The linewidth of the 589 nm was found to be less than 2.3 MHz. The bottleneck associated with this technique is a power limitation associated with the WDM that clamps the amount of 1121 nm that can be injected into the system. This, coupled with problems from SBS resulting from a Raman fiber of length 150 meters, results in relatively low output powers of 1178 nm. As a result, in order to generate the levels of 589 nm desired by the various telescopes, coherent beam combination of multiple Raman amplifiers is necessary. The result is a system of increased complexity.

Since astronomical telescopes are located in remote sites and often operate under difficult conditions, it is desirable to use a compact, maintenance-free, and rugged laser for the guide star system, such as a fiber laser. Because there are no fiber gain media that lase directly at 589 nm, the most promising way, to date, to achieve this is through second harmonic generation of 1178 nm. The present invention has the potential to generate 100 W of narrow linewidth 1178 nm from an all-fiber Raman laser for frequency doubling to 589 nm on the $D_{2a}$ line.

Another exemplary application in the 1200-1300 nm region is remote sensing of the water content of vegetation on earth from space. The goal is to improve the understanding of the biophysical and ecological processes governing the linked exchanges of water, energy, carbon and trace gases between the terrestrial biosphere and the atmosphere by improving satellite data products for models. 1240 nm having linewidths on the order of 100 MHz to 1 GHz in conjunction with 858.5 nm is of interest since the optical index R858.5/R1240 is mainly driven by the water thickness with smaller effects due to cellulose, lignin, and protein variation. The wavelength 1240 nm has been generated in the past using several methods to include external cavity diamond Raman lasers, an intra-cavity Raman laser, GaInNAs semiconductor diode lasers, optically pumped GaInNAs/GaAs and a Cr:forsterite multi-terawatt amplifier laser. Output powers are typically less than 5-6 W with the linewidth being determined by properties of the resonating cavity. High power levels of 1240 nm can be achieved in an all-fiber system with a controllable linewidth by the present invention.

Another exemplary application in the 1300-1500 nm region is the expansion of telecommunications bandwidth into the O, E, and S bands. This will require multiple closely spaced lasers having linewidths well exceeding a GHz in this spectral region. At the present time, some work has been done with seeded Raman lasers at 1300 nm. Such lasers are inefficient and typically of low output power because of having to insert and remove light through power sensitive components. Unseeded Raman lasers using phosphosilicate fiber by itself and in conjunction with germanosilicate fiber have been used to generate light in the 1400-1500 nm region. Such lasers can be of rather high output power but are of broad linewidth because of the lack of a seed or other measures to control the linewidth. The invention in this application can be utilized to provide a series of lasers having controllable linewidths in the 1300-1500 nm region to enable expansion of the telecommunications industry into other bands.

The current invention is aimed at overcoming the shortcomings associated with the current state-of-the-art to obtain high power (>50 W) from a Raman amplifier while controlling linewidth broadening.

SUMMARY

The current invention involves a Raman amplifier having a novel design enabling high Raman conversion efficiencies and output powers in addition to linewidths, which can be controllable by a seed source. In this invention, a rare-earth-doped Raman amplifier can be spliced directly onto a Raman resonator system. The rare-earth-doped amplifier can be both seeded with the initial signal (zeroth order Stokes) and the desired output signal ($N^{th}$ order Stokes) through a wavelength division multiplexer (WDM). The linewidth of the $N^{th}$ order Stokes seed can be equivalent to the desired output wavelength. The linewidth of the zeroth order Stokes can be broad enough to prevent Stimulated Brillouin Scattering (SBS) from being a limiting factor. The nonlinear process of SBS can thereby be avoided for all except possibly the $N^{th}$ Stokes signal if it is of narrow linewidth. Because of power limitations associated with the WDM, it is important to amplify the initial signal (zeroth order Stokes) to the desired level via an amplifier downstream from the WDM. This amplifier may consist of one or multiple stages with each stage being pumped with diodes. The desired output signal and amplified initial signal can then both be injected into the Raman resonator(s) where multiple orders of Stokes, up to the $N-1^{th}$ Stokes order, are generated in one or more Raman amplifiers. Note that the Raman Resonator system can be configured to be fully nested or completely unnested. The desired signal ($N^{th}$ order Stokes) passes through the system and is amplified by the $N-1^{th}$ order Stokes signal. To increase the efficiency of the system, a highly reflective Bragg grating centered at the pump wavelength can be included downstream from the Raman fiber to enable reflection of any unused pump light back through the Raman fiber. In addition, long period gratings or tilted Bragg gratings can be placed between the rare-earth-doped Raman amplifier and the Raman resonators to protect all of the components upstream as well as to ensure high efficiency of the rare-earth-doped amplifier at the zeroth order Stokes wavelength. The linewidth can be controlled, first by seeding and subsequently through a slight wavelength offset of one Bragg grating in each resonator to limit the linewidth of the Stokes order that resonates as well as by providing some mitigation of four-wave mixing, the primary cause of linewidth broadening. This offset can be accomplished in various ways to include temperature, bending, stretching, etc. In addition, high-dispersion Raman fiber can also be utilized to break the phase matching condition for four-wave mixing.

Relative to the current state-of-the-art, the present invention is capable of high-power operation with a controllable linewidth. Because the rare-earth amplifier can be spliced directly onto the Raman resonator, high-power operation is possible, since there are no bottlenecks involving components, which are power limited. Also, because a rare-earth amplifier can be used instead of an oscillator which builds up high power levels in the cavity, the maximum output power achievable from the rare-earth amplifier and ultimately the Raman resonator system can be greater than that achievable with a rare-earth oscillator. Also, because a high power level of the $N-1^{th}$ Stokes order required for amplification of the desired output wavelength can be obtained within the Raman resonator system, high Raman conversion efficiencies are also obtainable. This enables usage of a very short length of Raman fiber (a couple of meters), which in turn leads to a high threshold for Stimulated Brillouin Scattering and higher, achievable output powers for narrow linewidth outputs. In addition, a controllable linewidth is also possible due to various linewidth broadening mitigation measures to include an offset of the Bragg grating pairs associated within each resonator, utilization of high dispersion Raman fiber, and utilization of a signal seed with the desired linewidth. All linewidths within the system except the seed should be broad enough to avoid SBS issues. The current invention is also compatible with all techniques to mitigate SBS, including multiple temperature zones, stress, acoustically tailored fiber, different types of fiber, large mode area fiber, etc. Finally, the invention is compatible with both phase modulation (PM) and non-PM modes of operation, as well as pulsed or continuous wave operation.

An exemplary application is the generation of very narrow linewidth 1178 nm for sodium guidestar laser applications. The present invention details a method to obtain high output powers of 100 W or more from an 1178 nm laser with a linewidth of less than 10 MHz in an all-fiber Raman system. This application involves a system that is co-seeded into the fiber core with both a narrow linewidth (10 MHz) 1178 nm signal ($2^{nd}$ order Stokes) and a 1069 nm signal (zeroth order Stokes) that is broad enough that SBS will not be an issue.

Another exemplary application in the 1200-1300 nm region is remote sensing of the water content of vegetation on earth from space. 1240 nm with a controllable linewidth can be achieved in a seeded system using two Raman cavities along with germanosilicate fiber. A final exemplary application of the invention in this patent holds the potential for producing high power output power from an all fiber system between 1300-1500 nm with a controllable bandwidth through the usage of multiple Raman resonator cavities.

DETAILED DESCRIPTION

The two generic embodiments representing the extremes of Raman resonator configurations for the invention described in this patent are described. One embodiment consists of a rare-earth-doped fiber amplifier spliced to a Raman resonator configuration that is fully nested. The other embodiment consists of a rare-earth-doped fiber amplifier spliced to a completely linear, unnested, Raman resonator configuration. Anyone skilled in the art will realize that other configurations lying between these two extremes are possible.

Nested Raman Resonator Embodiment

Figure 1:
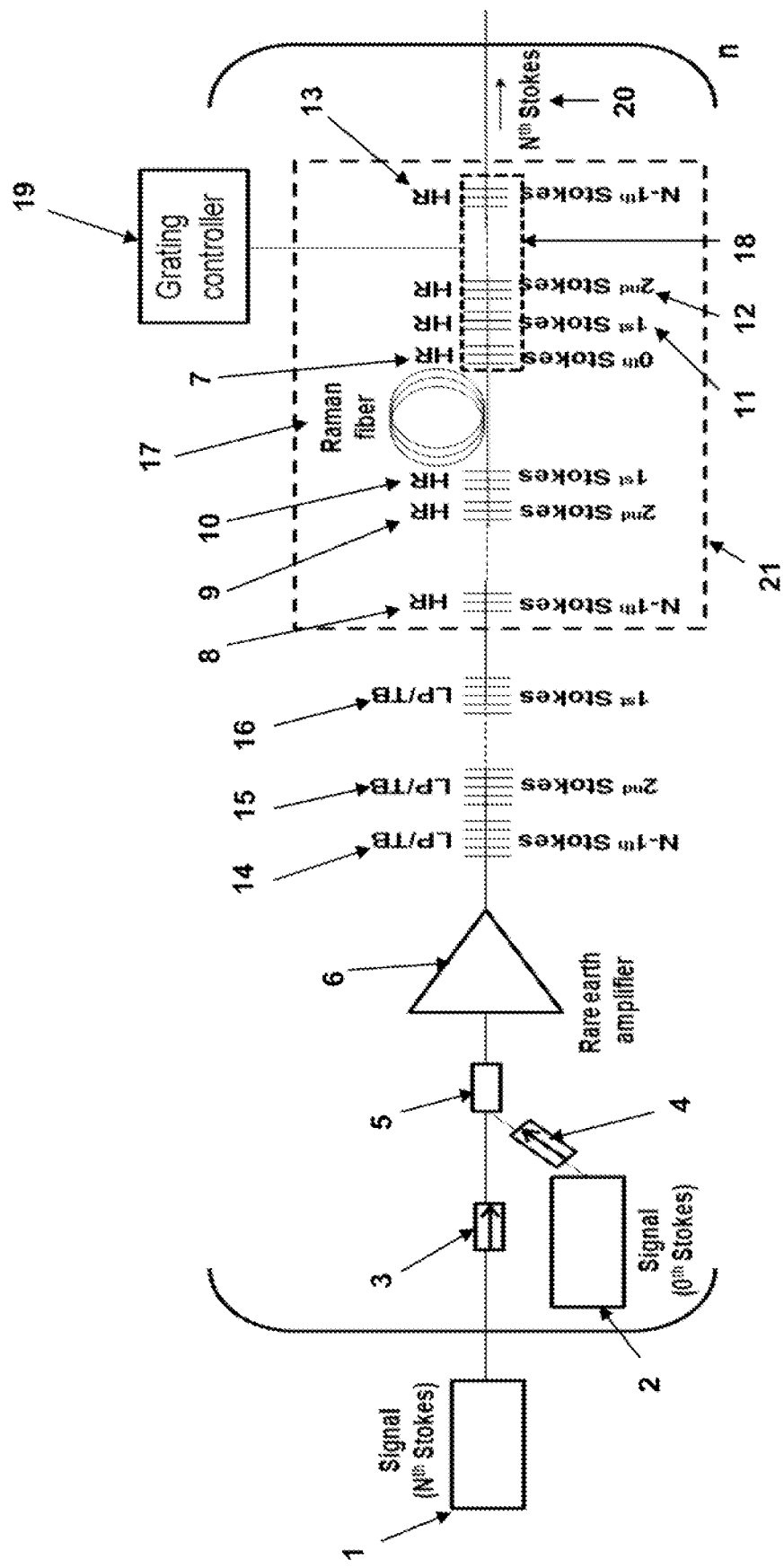
FIG. 1 is a diagram of a generic rare-earth-doped amplifier/Raman amplifier in a fully nested configuration.

A block diagram of the fully nested Raman resonator embodiment is shown in FIG. 1. The first device in the diagram is a seed source 1 tuned to the desired output wavelength, the $N^{th}$ order Stokes line. It may be created in a number of was to include frequency doubling of a source at a longer wavelength. This device needs to have the linewidth desired of the output. Another device in the diagram is a seed source 2 tuned to the necessary wavelength (zeroth order Stokes line) to enable generation of an $N^{th}$ order Stokes signal at the desired wavelength. This device needs to have a linewidth broad enough so as to prevent SBS from being an issue. The output of the source tuned to the $N^{th}$ order Stokes line 1 is passed through an isolator 3 and into a WDM 5. The output of the source tuned to the zeroth order Stokes 2 is passed through an isolator 4 and into the WDM 5. The WDM 5 puts both the zeroth order and the $N^{th}$ order Stokes signals into the core of the fiber. Both signals then enter a rare-earth-doped amplifier 6 which amplifies the signal. The amplifier 6 may consist of one or more stages in order to reach the desired power level of the zeroth order Stokes signal. The amplified zeroth order Stokes signal and the seed for the $N^{th}$ order Stokes line is injected into Raman resonators in a fully nested configuration as defined by pairs of Bragg gratings 8-13. Prior to entering the Raman resonators, the zeroth and $N^{th}$ order Stokes signals pass through several long period or tilted Bragg gratings (LP/TB) 14-16 whose role is to bring about absorption of any first through N-1$^{th}$ order Stokes signals that leak through the Bragg gratings 8-10 back toward the rare-earth-doped amplifier 6. The Raman resonators are nested such that the innermost resonator is tuned to the first order Stokes line with Bragg gratings 10 and 11 both being high reflectors with a center wavelength at the first order Stokes line. The next innermost resonator is tuned to the second order Stokes line etc. via gratings 9 and 12 which are high reflectors centered at the second order Stokes line. The outermost Raman resonator is tuned to the N-1$^{th}$ order Stokes line via gratings 8 and 13 which are high reflectors centered at the order Stokes line. These nested Raman resonators 21 are enclosed by dashed lines in FIG. 1. The zeroth order Stokes signal passes into the nested Raman resonators and is converted to the first order Stokes signal by the resonator tuned to the first order Stokes line 10, 11. Any unconverted zeroth order Stokes signal is then reflected back into the Raman fiber 17 via a high reflector 7 tuned to the zeroth order Stokes line. The first order Stokes signal is then converted to the second order Stokes signal by the resonator tuned to the second order Stokes line 9, 12 and is eventually convened to the N-1$^{th}$ order Stokes signal by the resonator tuned to the N-1$^{th}$ order Stokes line 8, 13. Because there are no highly reflective Bragg gratings with a center wavelength at the $N^{th}$ order Stokes line, the $N^{th}$ order Stokes signal passes straight through the nested Raman resonators defined by the Bragg gratings 8-13 and is amplified by the N-1$^{th}$ order Stokes signal in the Raman resonator tuned to the N-1$^{th}$ order Stokes line. The amplification occurs in the Raman fiber 17 which is either phosphosilicate, germanosilicate or some other variety of photosensitive fiber. The output of the amplifier is the $N^{th}$ order Stokes signal 20. Because of potentially low seed powers at the desired output wavelength, it may be necessary to have multiple rare-earth-doped amplifier/Raman resonator configurations in series to enable amplification of the desired output wavelength to the power levels desired. This embodiment is compatible with all SBS mitigation techniques to include multiple temperature zones, strain, large mode area fibers, multiple fiber types, acoustically tailored fiber, etc. In addition, the embodiment is compatible with both polarized and unpolarized modes of operation as well as continuous wave and pulsed operation.

To enable controlled linewidth operation, multiple measures can be taken. These measures include usage of a seed far the $N^{th}$ order Stokes signal having the desired output linewidth. In order to prevent the linewidth of the $N^{th}$ order Stokes seed from broadening as it is amplified, it is imperative that the linewidth of the N-1$^{th}$ order Stokes signal be controlled. This can be accomplished by using a linewidth for the zeroth order Stokes signal that is broad enough to prevent SBS from being an issue. Although seeding the amplifier with the desired output wavelength will result in a narrower output signal than if the system were seeded by spontaneous Raman scattering, additional measures are needed within the individual Raman resonators to prevent linewidth broadening of the zeroth order Stokes signal as it is converted to higher Raman orders. Control of the linewidth of the various Stokes orders can be accomplished by shifting the center wavelength of one grating of each pair 18 slightly through either heating, bending, stretching, etc. through a grating controller 19. This has the effect of impeding four-wave mixing, the primary source of linewidth broadening, as well as narrowing the bandwidth that will be amplified at each Stokes order. In addition, high dispersion Raman fiber can be used to break the phase matching condition for four-wave mixing. One or more of these measures in combination should work to limit broadening of the linewidth.

The factors enabling a high output power level of the $N^{th}$ order Stokes signal in this invention are the generation of very high levels of the N-1$^{th}$ order Stokes signal in the Raman resonator tuned to the N-1$^{th}$ order Stokes line in addition to seeding with the $N^{th}$ order Stokes signal. This occurs for two reasons, first, high power levels of the zeroth order Stokes are directly injected into the system and second, because the Raman cavities are defined by high reflector Bragg gratings, the power level in the system is able to build up to high levels in all the Raman cavities. High power levels of the N-1$^{th}$ order Stokes signal which is created from the zeroth order Stokes signal in addition to seeding at the $N^{th}$ order Stokes line leads to good conversion from the zeroth order Stokes signal to the $N^{th}$ order Stokes signal in a short Raman fiber. In addition, the short Raman fiber enables a high SBS threshold, which enables a higher output power level of the $N^{th}$ order Stokes signal. Negatively, this embodiment will suffer substantial thermal stress because of high power levels in the Raman fiber and on the Bragg gratings, since all of the Raman resonators overlap.

Unnested Raman Resonator Embodiment

The embodiment representing the other extreme is a series of completely untested Raman resonators. In this configuration, multiple Raman resonators in series are used to shift the zeroth order Stoke input signal out to the N-1$^{th}$ order Stokes line to enable amplification of the $N^{th}$ order Stokes input signal. The amplifier is in a linear configuration with each Raman resonator having the same or different kinds of photosensitive (or nonphotosensitive) fiber. The system is co-seeded with both the initial zeroth order Stokes signal as well as the desired $N^{th}$ order Stokes output signal.

Figure 2:
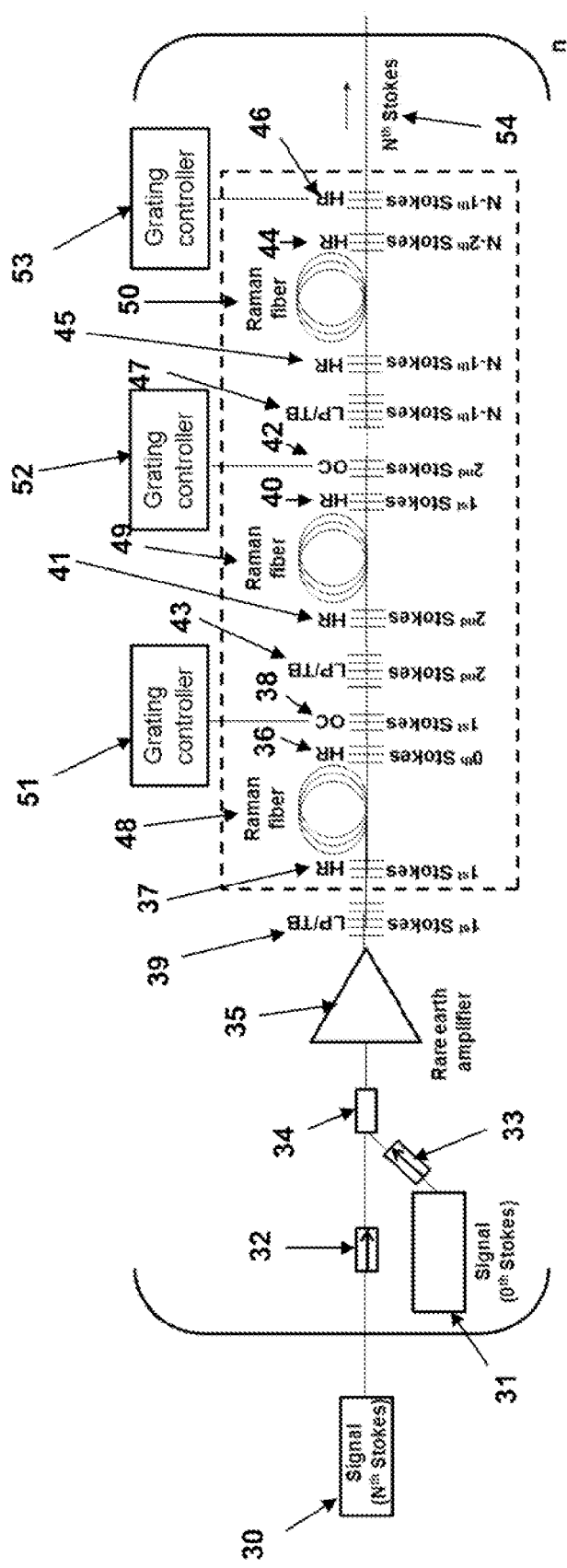
FIG. 2 is a diagram of a generic rare-earth-doped amplifier/Raman amplifier in a linear (non-nested) configuration.

A block diagram of the unnested Raman resonator system is shown in FIG. 2. The first device in the diagram is a source 30 at the $N^{th}$ order Stokes line having the desired output linewidth. The source at the $N^{th}$ order Stokes line may be created in a number of ways to include frequency doubling of a source at a longer wavelength. Another device is a source 31 tuned to the wavelength of the zeroth order Stokes line. This device should have a linewidth broad enough so that SBS is not an issue. The output of the source tuned to the $N^{th}$ order Stokes line 30 is passed through an isolator 32 and into a WDM 34. The output of the source tuned to the zeroth-order Stokes line 31 is passed through an isolator 33 and into the WDM 34. The WDM 34 puts both the zeroth and the $N^{th}$ order Stokes lines into the core of the fiber. The zeroth and the $N^{th}$ order Stokes lines then enter an amplifier 35 which amplifies the zeroth order Stokes signal. The amplifier 35 may consist of one or more stages in order to reach the desired power level for the zeroth-order Stokes signal. The output of amplifier 35 which includes the amplified zeroth order Stokes signal and the seed for the $N^{th}$ order Stokes line is passed through either a long period or tilted Bragg (LP/TB) grating tuned to the first-order Stokes line 39 and is injected into the first Raman resonator in a series of Raman resonators within the dashed lines of FIG. 2. The zeroth-order Stokes signal passes through a high reflector Bragg grating 37 tuned to the first-order Stokes line and into the Raman fiber 48 which may be germanosilicate, phosphosilicate or some other kind of photosensitive (or nonphotosensitive) fiber. An unused zeroth-order Stokes signal is reflected back into the Raman fiber 48 by a high reflector Bragg grating 36 set at the zeroth-order Stokes line. In this resonator defined by the high reflector Bragg grating 37 and the Bragg grating 38, which is an output coupler (OC), the zeroth order Stokes signal is converted to the first-order Stokes signal via the Raman process in the Raman fiber 48. The size of the Raman shift is dependent on the type of Raman fiber used. Any first-order Stokes signal that leaks out of the Bragg grating 37 back toward the rare-earth-doped amplifier 35 will be put into the cladding by the long period or tilted Bragg grating 39, where it will be absorbed. The $N^{th}$ and first-order Stokes signals then pass through a long period grating 43 set at the second-order Stokes line and enter the second Raman resonator in the series defined by the Bragg grating 41, which is a high reflector, and the Bragg grating 42, which is an output coupler. In this resonator the first-order Stokes signal is converted to the second-order Stokes signal in the Raman fiber 49, which may be the same or different than the Raman fiber 48. Any unused first-order Stokes signal will be reflected back into the Raman fiber 49 by the high reflector Bragg grating 40 which is centered at the first order Stokes line. Any second order Stokes signal which leaks out of the Bragg grating 41 back toward the rare-earth-doped amplifier 35 will be put into the cladding by the long period or tilted Bragg grating 43 and absorbed. Eventually, the N-$2^{th}$ order Stokes signal which has been created from the zeroth order Stokes signal together with the $N^{th}$ order Stokes signal enters the last Raman resonator in the series. This resonator is tuned to the N-$1^{th}$ order Stokes line and is defined by the Bragg gratings 45 and 46, which are both high reflectors. Within this Raman resonator the N-$2^{th}$ order Stokes signal is converted to the N-$1^{th}$ order Stokes signal in the Raman fiber 50, which may be the same or different than the Raman fibers 48 or 49. Any unused N-$2^{th}$ order Stokes signal will be reflected back into the Raman fiber 50 by the Bragg grating 44, which is a high reflector tuned to the N-$2^{th}$ order Stokes line. Also, any N-$1^{th}$ order Stokes signal which leaks out of the Bragg grating 45 back toward the rare-earth-doped amplifier 35 will be put in the cladding by the long period or tilted Bragg grating 47 and absorbed. Upon entering the Raman resonator tuned to the N-$1^{th}$ order Stokes line, the seed for the $N^{th}$ order Stokes line is amplified in a single pass through the resonator. The output of the Raman amplifier is the greatly amplified $N^{th}$ order Stokes line 54. Once again, because of potentially low seed powers at the desired output wavelength, it may be necessary to have multiple rare-earth-doped amplifier/Raman resonator configurations in series to enable amplification of the desired output wavelength to the power levels desired. This embodiment is compatible with all SBS mitigation techniques to include multiple temperature zones, strain, large mode area fibers, acoustically tailored fibers, different types of fiber etc. The embodiment is also compatible with both polarized and unpolarized modes of operation as well as continuous wave or pulsed operation.

To enable controlled linewidth operation, multiple measures can be taken. These include usage of a seed at the $N^{th}$ order Stokes line having the desired output linewidth. In order to prevent the linewidth of the $N^{th}$ order Stokes seed from broadening, it is imperative that the linewidth of the N-$1^{th}$ order Stokes signal amplifying it be prevented from being too broad. This can be accomplished by using a linewidth for the zeroth order Stokes signal that is broader than the linewidth required to prevent SBS from being an issue. Although seeding the amplifier with the desired output wavelength will result in a narrower output signal than if the system were seeded by spontaneous Raman scattering, additional measures are needed within the individual Raman resonators to prevent linewidth broadening of the zeroth-order Stokes signal as it is converted to higher Raman orders. Control of the linewidth of the various Stokes orders can be accomplished by shifting the center wavelength of one grating of each pair 38, 42, and 46 slightly by either heating, bending, stretching, etc. through the grating controllers 51-53. This will impede four-wave mixing and will help control the bandwidth being amplified at each Stokes order, thus helping to keep the linewidth of the intermediate Stokes orders from broadening. Also, usage of a high-dispersion Raman fiber to break the phase-matching condition associated with four-wave mixing is another measure that can be taken. One or more of these measures in combination should work to control the linewidth of the output of the Raman amplifier.

As before, the factors enabling a high output power level of the $N^{th}$ order Stokes signal in this invention are the generation of high levels of the N-$1^{th}$ order Stokes signal in the Raman resonator tuned to the N-$1^{th}$ order Stokes line in addition to seeding with the $N^{th}$ order Stokes signal. Relative to the previous embodiment where the Bragg gratings defining the Raman cavities were high reflectors, power levels obtainable in the resonators in this system will be less since one Bragg grating defining each cavity will be an output coupler. In addition, the power level in each successive Raman cavity will diminish. Because of this, a decreased output power level of the $N^{th}$ order Stokes signal relative to the fully nested configuration is expected. Positively, this embodiment relative to the fully nested configuration will have much less thermal stress associated with it since there will be less power in each Raman fiber and on each Bragg grating.

Sodium Guidestar Laser System

An exemplary application of the invention is a system that generates a narrow linewidth laser beam of about 1178 nm for second-harmonic generation to 589 nm for guide star lasers (e.g., sodium guidestar lasers). The main requirements associated with a guide star laser (which will be referred to herein as "sodium guidestar laser") system are linewidths on the order of 10 MHz along with output powers of 589 nm on $D_{2a}$ greater than 50 W. A linewidth of 10 MHz which equates to the natural linewidth of sodium is required in order to enable excitation of the same velocity group. The invention described in this application has sufficient output power at 1178 nm to enable the 589 nm target power levels.

Figure 3:
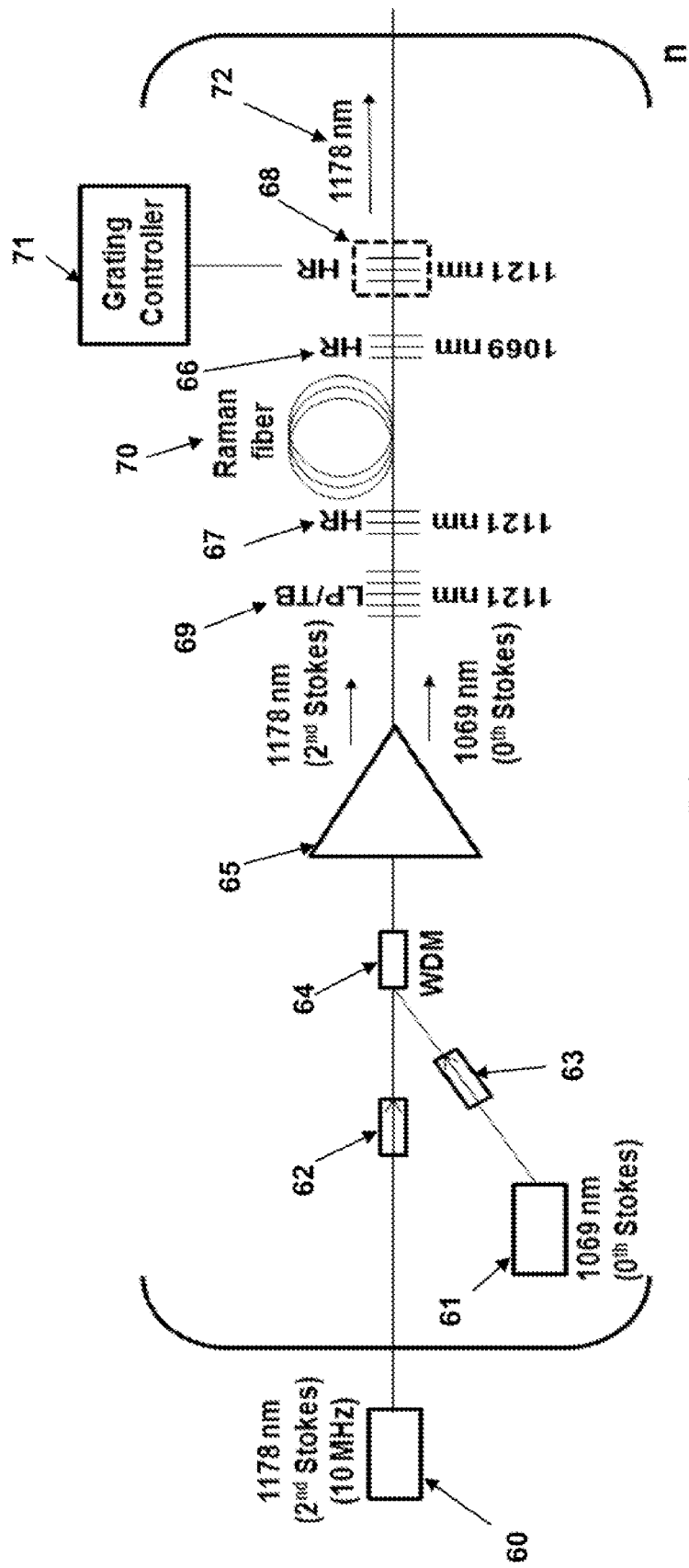
FIG. 3 is a diagram of a sodium guidestar laser system configuration.
Figure 4:
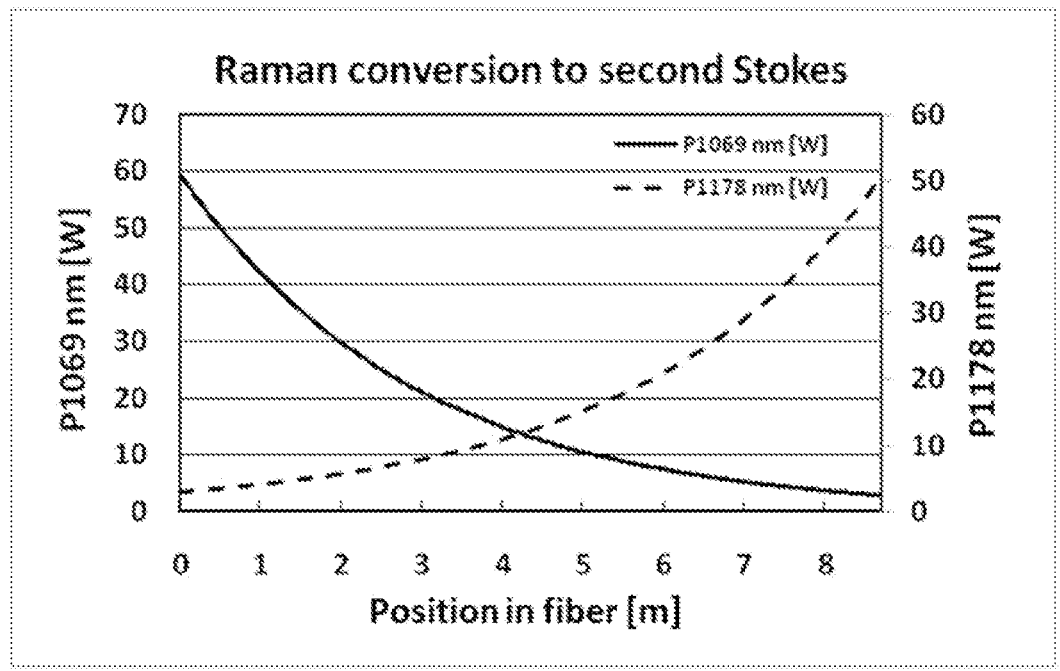
FIG. 4 is a plot of the 1069 nm and 1178 nm cavity intensity as a function of the position in the fiber for the case of 9 meters of 20/400 fiber pumped with 59.3 W of 1069 nm and seeded with 3 W of 1178 nm for the sodium guidestar laser configuration of FIG. 3.
Figure 5:
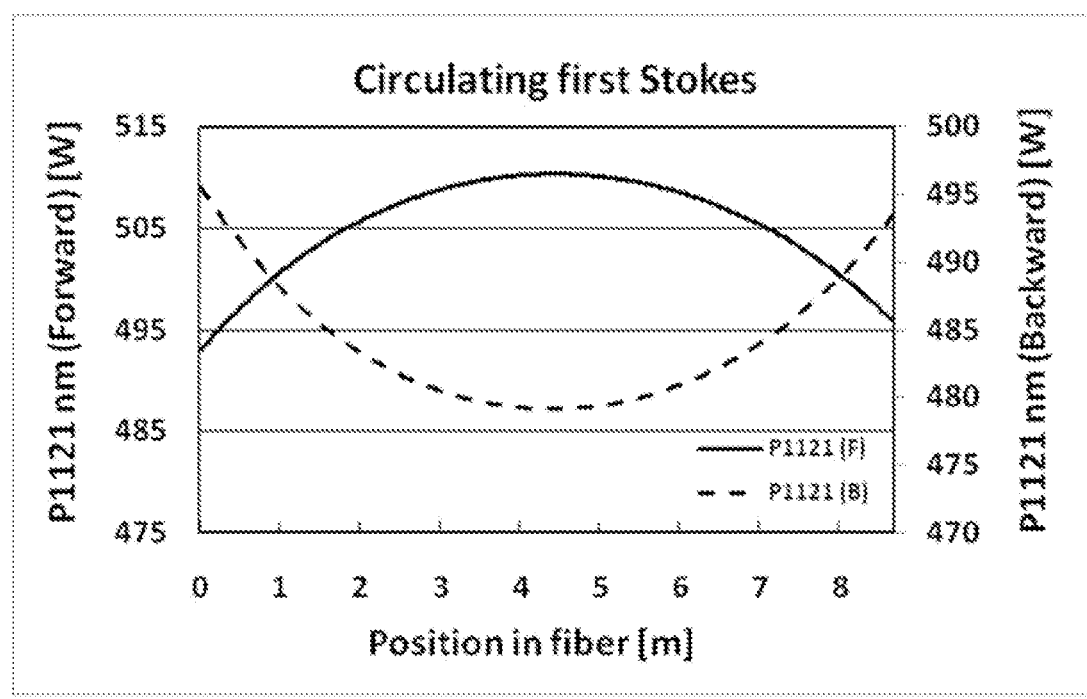
FIG. 5 is a plot of the first Stokes line (1121 nm) cavity intensity in the forward and backward directions as a function of the position in the fiber for the case of 9 m of 20/400 fiber pumped with 59.3 W of 1069 nm and seeded with 3 W of 1178 nm.

A block diagram of this system is shown in FIG. 3. The first device in this diagram is the second-order Stokes signal 60 at 1178 nm, the desired output signal, having a narrow linewidth (10 MHz). The system is co-seeded with a zeroth-order Stokes seed 61 at 1069 nm having a linewidth broad enough so that SBS is not an issue. The zeroth-order Stokes signal at 1069 nm is passed through an isolator 63 and into a WDM 64. The second-order Stokes signal at 1178 nm is passed through an isolator 62 and into the same WDM 64. The WDM 64 places both the zeroth and the second-order Stokes signals into the core of the fiber. Both the zeroth and second-order Stokes signals enter an ytterbium-doped rare-earth amplifier 65 where the zeroth-order Stokes signal is amplified. The amplified zeroth-order Stokes signal along with the second-order Stokes signal pass through a long-period or tilted Bragg (LP/TB) grating 69 tuned to 1121 nm and enter the Raman resonator configuration defined by high-reflector (HR) Bragg gratings 67 and 68 tuned to 1121 nm. The zeroth-order Stokes 1069 nm signal, upon entering the 1121 nm Raman resonator, is converted to the first-order Stokes signal at 1121 nm by the Raman process in the silica or germanosilicate fiber 70. FIG. 4 shows the fall-off of the zeroth order Stokes signal at 1069 nm and the growth of 1178 nm via the Raman conversion process as a function of position in the Raman fiber for the case of 9 meters of 20/400 fiber pumped with 59.3 W of 1069 nm and seeded with 3 W of 1178 nm. Any unconverted zeroth-order Stokes signal at 1069 nm will be reflected back into the Raman fiber 70 by the high-reflector Bragg grating 66 tuned to the zeroth-order Stokes line. Because high power levels of 1121 nm are obtained in the Raman resonator cavity, leakage through the Bragg grating 67 back toward the ytterbium-doped rare-earth amplifier 65 will most likely occur. To prevent this light from entering the amplifier 65, a long period or tilted Bragg grating 69 is used to divert the 1121 nm into the cladding, where it will be absorbed. FIG. 5 shows the power levels for the circulating first Stokes in the right-propagating and left-propagating directions. The second-order Stokes seed at 1178 nm will pass through the amplifier system with minimal reflections into the Raman resonator cavity tuned to 1121 nm where it will be amplified to high power and emerge from the amplifier 72. As before, because of potentially low seed powers at the desired output wavelength, it may be necessary to have multiple rare-earth-doped amplifier/Raman resonator configurations in series to enable amplification of the desired output wavelength to the power levels desired. The embodiment of the 1178 system is compatible with all techniques to suppress SBS to include large mode area fiber, multiple temperature zones, strain, acoustically tailored fiber, multiple types of fiber, etc. It is also compatible with polarized and unpolarized modes of operation as well as continuous wave or pulsed operation on the order of a microsecond. The cavity buildup time has been for this system has been calculated to be 2.5 microseconds.

Figure 6:
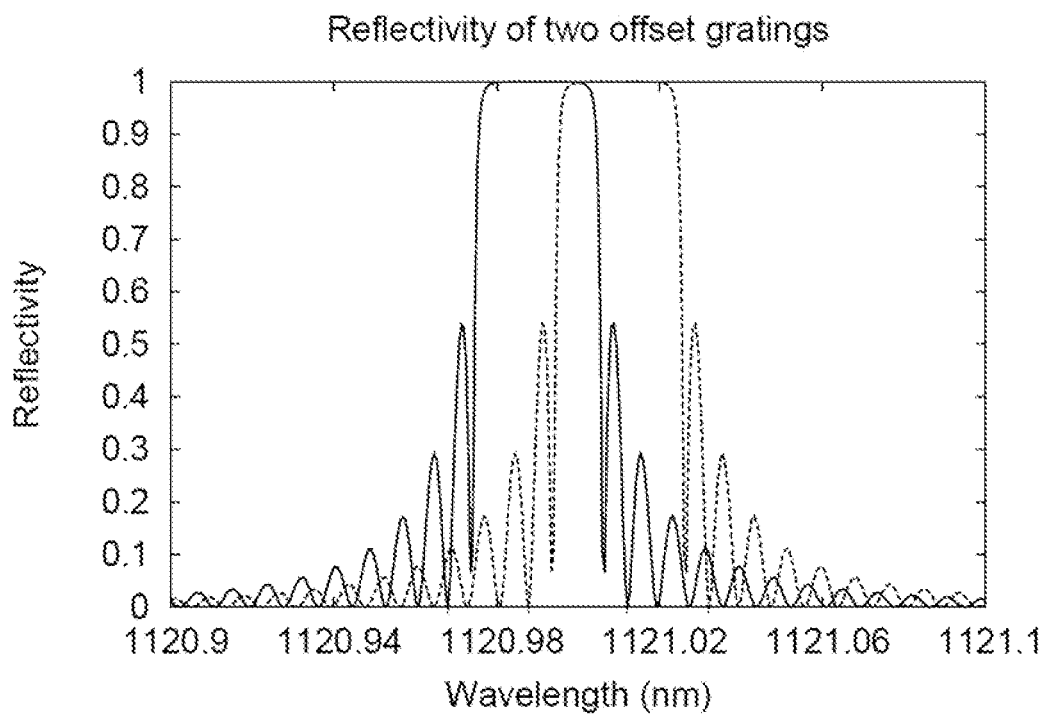
FIG. 6 is a plot of the calculated reflectivity for a pair of uniform gratings 5 cm in length with B=10 that are offset by 0.02 nm. The resulting cavity has high reflectivity only over a few GHz with these gratings.

To prevent significant linewidth broadening of the 10 MHz 1178 nm seed, one of the 1121 nm Bragg gratings 68 needs to be offset so that four-wave mixing is impeded and the bandwidth that resonates is narrowed. For example, a cavity defined by a pair of Bragg gratings 5 cm in length with a B of 10, can achieve a grating offset of 0.02 nm with a 2° C. temperature difference between the gratings. Here $B=4n\, \delta n\, \eta\, L/\lambda$, where n is the mean refractive index of the fiber core, $\delta n$ is the modulation of the refractive index, $\eta$ is the fraction of light in the core, L is the grating length, and $\lambda$ is the phase-matched wavelength. Such a cavity will have a high reflectivity over only a few GHz. The transmission of the two offset gratings is shown in FIG. 6. This will result in less broadening of the 1178 nm when it is amplified. Also, high dispersion Raman fiber can also be used to break the phase-matching condition associated with four-wave mixing. In summary, factors enabling a narrow linewidth output at 1178 nm are seeding, offset of Bragg gratings in the 1121 nm cavity, and usage of a high-dispersion Raman fiber.

Figure 7:
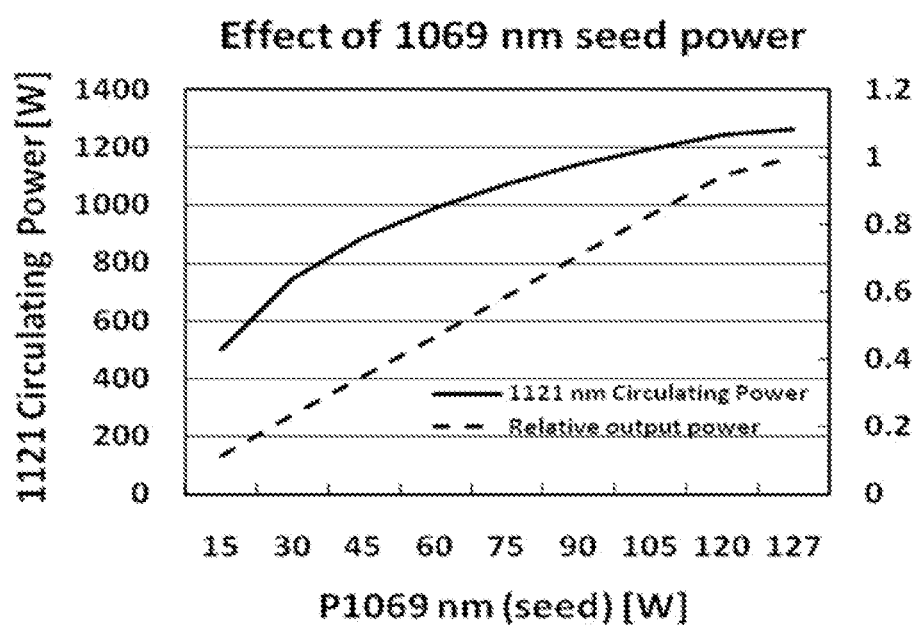
FIG. 7 is a plot of the effect of 1069 nm seed power on the 1121 nm circulating power and the relative 1178 nm output power.
Figure 8:
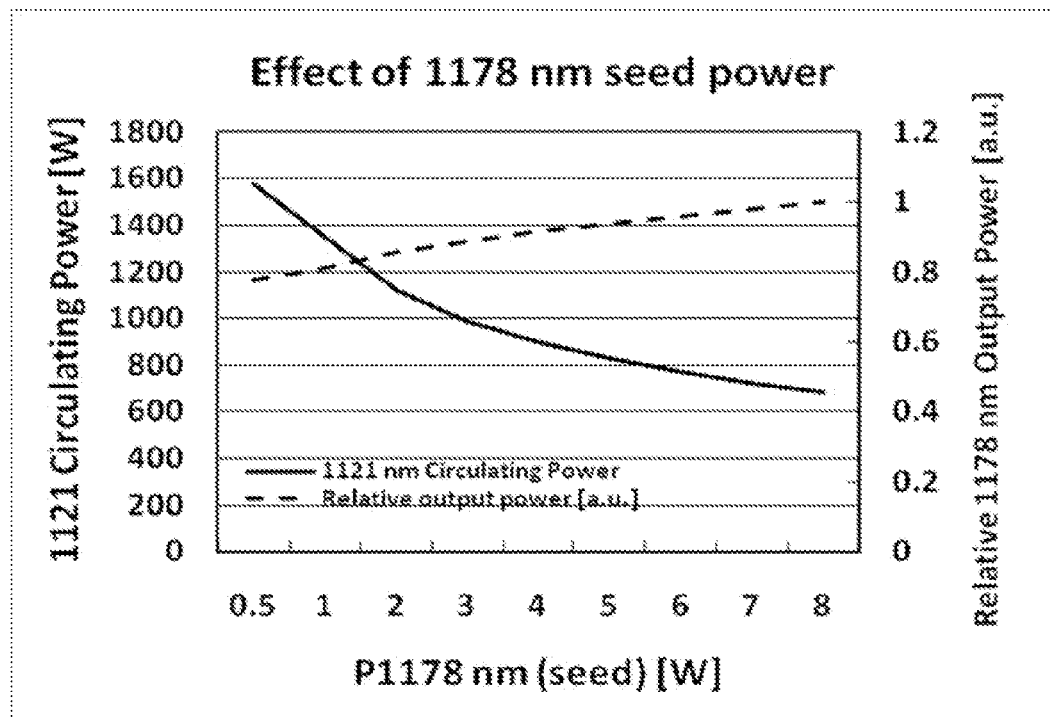
FIG. 8 is a plot showing the effect of 1178 nm seed power on the 1121 nm circulating power and the 1178 nm relative output power.
Figure 9:
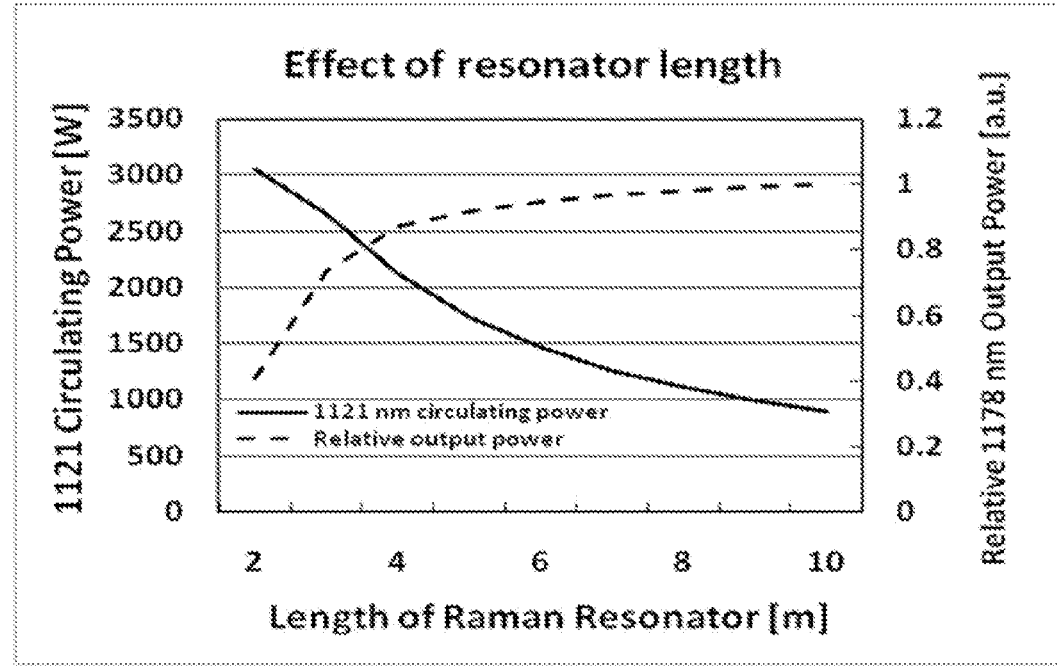
FIG. 9 is a plot showing the effect of the 1121 nm resonator length on the 1121 nm circulating power and the 1178 nm relative output power.

The required power level for the 1069 nm zeroth-order Stokes seed signal 60 depends on the seed level required within the amplifier 65 for the output power desired. Power levels associated with the 1121 nm in the resonator must be considered when designing the system due to power limitations associated with the Bragg gratings. Parameters which affect the power of 1121 nm in the resonator include: 1069 nm input power level into the Raman resonator; 1178 nm seed power level; and the length of the Raman fiber. In addition, the onset of SBS must be considered for narrow linewidth applications such as this one. As the input power level of 1069 nm into the Raman resonator increases, the 1121 nm circulating power in the resonator, the output power of 1178 nm, and the SBS increase, FIG. 7. As the input power level for the 1178 nm seed increases, the 1121 nm circulating power decreases, the 1178 nm output power increases, and the SBS increases, FIG. 8. Also, as the length of the 1121 nm resonator increases, the 1121 nm circulating power decreases, the 1178 nm output power increases, and the SBS increases, FIG. 9. Generally, SBS mitigation measures will enable an increased 1178 nm seed level or an increased resonator cavity length, a higher output power of 1178 nm, and a decreased 1121 nm circulating power in the resonator.

The factors enabling a high output power level of narrow linewidth 1178 nm in this invention are the generation of very high levels of the first order Stokes line in the 1121 nm Raman resonator, in addition to the fact that the system is seeded. This high power occurs for two reasons, first, high power levels of the 1069 nm are directly injected into the system and second, because the 1121 nm cavity is defined by high reflector Bragg gratings, the power level is able to build up to high levels. High power levels of 1121 nm in addition to seeding at 1178 nm leads to good conversion from 1121 to 1178 nm in a short Raman fiber, several meters in length. In addition, the short Raman fiber enables a high SBS threshold which enables a higher output power level of 1178 nm. Because high output power levels of 1178 nm can be obtained from one amplifier, coherent combination of two or more amplifier chains is not necessary. The result is a simpler system.

Remote Sensing Laser System—Nested Raman Resonator

Figure 10:
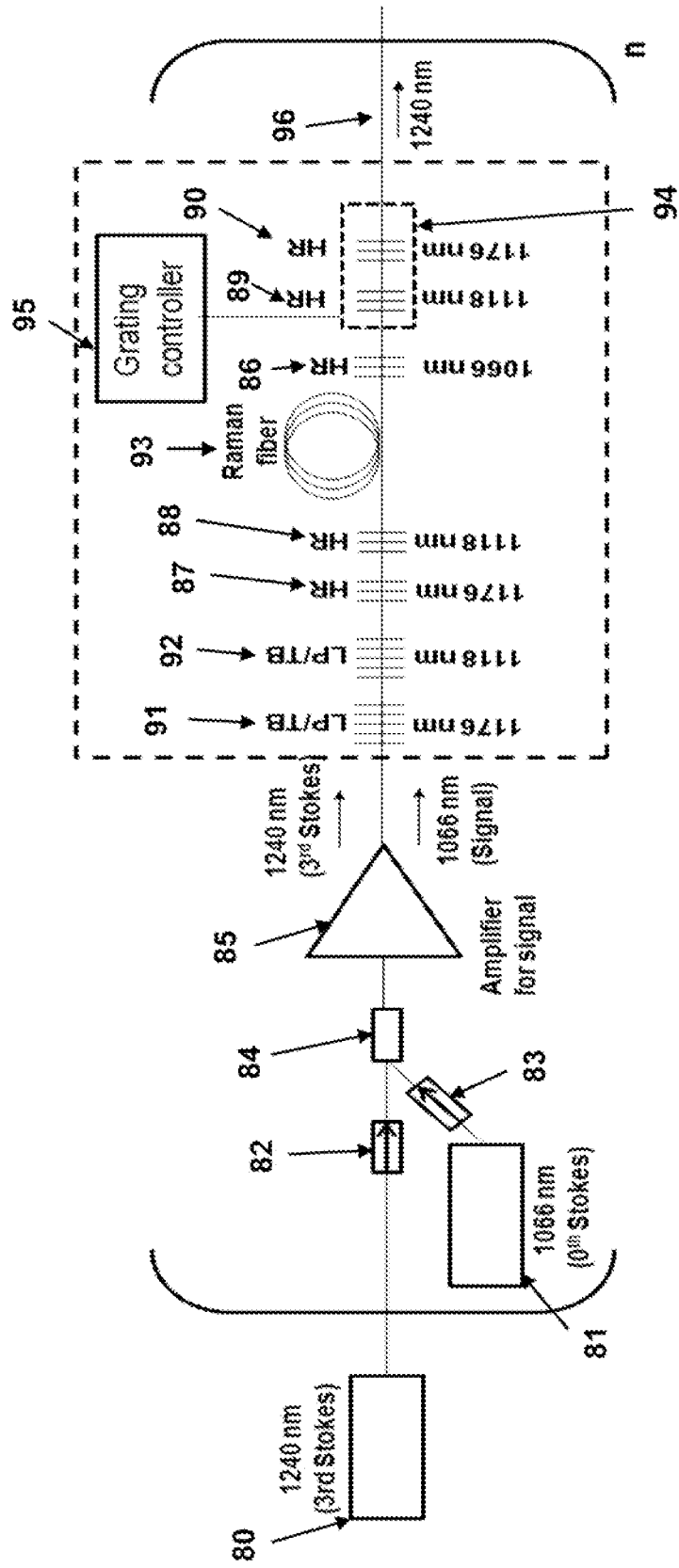
FIG. 10 is a diagram of a 1240 nm rare-earth-doped amplifier/Raman amplifier in a fully nested configuration.

Another special case of the above embodiments are systems which generate 1240 nm for remote sensing of the water content of the earth and other planets. A block diagram for the system is shown in FIG. 10. The first device in this diagram is a third-order Stokes signal 80 tuned to 1240 nm having the desired output linewidth. The system is co-seeded with a zeroth-order Stokes signal 81 at 1066 nm. The linewidth of this should be broad enough to avoid problems with SBS, but narrower or the same as the linewidth of the desired 1240 nm output. The third-order Stokes signal at 1240 nm is passed through an isolator 82 and into a WDM 84. The zeroth-order Stokes signal at 1066 nm is passed through an isolator 83 and into a WDM 84. The WDM 84 places both the zeroth and the third-order Stokes signals into the core of the fiber. Both the zeroth and third-order Stokes signals enter a ytterbium-doped rare-earth amplifier 85 where the zeroth-order Stokes signal is amplified. The amplified zeroth-order Stokes signal at 1066 nm along with the third-order Stokes seed at 1240 nm pass through two long-period or tilted-Bragg gratings 91 and 92 tuned to 1176 and 1118 nm, respectively, and enter the Raman resonator configuration. Upon entering the 1118 nm Raman resonator defined by the highly reflective Bragg gratings 88 and 89, the 1066 nm zeroth order Stokes signal is converted to the first order Stokes line at 1118 nm by the Raman process in silica or germanosilicate Raman fiber 93. Any unconverted zeroth-order Stokes signal at 1066 nm will be reflected back into the Raman fiber 93 by the high reflector Bragg grating 86 tuned to the zeroth order Stokes line at 1066 nm. Because high power levels of 1118 nm are obtained in the Raman resonator cavity, leakage through the Bragg grating 88 back toward the ytterbium-doped rare-earth amplifier will most likely occur. To prevent this light from entering the amplifier 85, a long-period or tilted Bragg grating is used to divert the 1118 nm into the cladding where it will be absorbed. The first-order Stokes line at 1118 nm is then converted to the second-order Stokes line at 1176 nm. Any unconverted 1118 nm first-order Stokes signal is redirected back into the Raman fiber 93 by the highly reflective Bragg grating 89. Also, any 1176 nm second-order Stokes signal that leaks out of the Raman resonator cavity through the Bragg grating 87 will be directed by the long-period or tilted Bragg grating 91 into the cladding where it will be absorbed. The third-order Stokes seed at 1240 nm will pass through the amplifier system into the Raman resonator cavity tuned to the second-order Stokes line at 1176 nm where it will be amplified to high power and output from the amplifier 96. SBS needs to be considered for the 1240 nm only if it is narrow linewidth. Once again, because of potentially low seed powers at the desired output wavelength, it may be necessary to have multiple rare-earth-doped amplifier/Raman resonator configurations in series to enable amplification of the desired output wavelength to the power levels desired. The embodiment shown in FIG. 10 is compatible with all techniques to suppress SBS to include large mode area fiber, strain, multiple temperature zones, acoustically tailored fiber, multiple types of fiber, etc. The embodiment is also compatible with polarized and unpolarized modes of operation as well as continuous wave or pulsed operation.

To prevent significant linewidth broadening of the 1240 nm seed, one of the Bragg gratings 89 and 90 in each of the 1118 and 1176 nm resonators needs to be offset so that four-wave mixing is impeded and the bandwidth that resonates is narrowed. Offset of the Bragg gratings can be accomplished using a grating controller 95 to either stretch, heat, or bend the gratings. Finally, a high-dispersion Raman fiber can also be used to break the phase matching condition associated with four-wave mixing.

Remote Sensing Laser System—Unnested Raman Resonator

Figure 11:
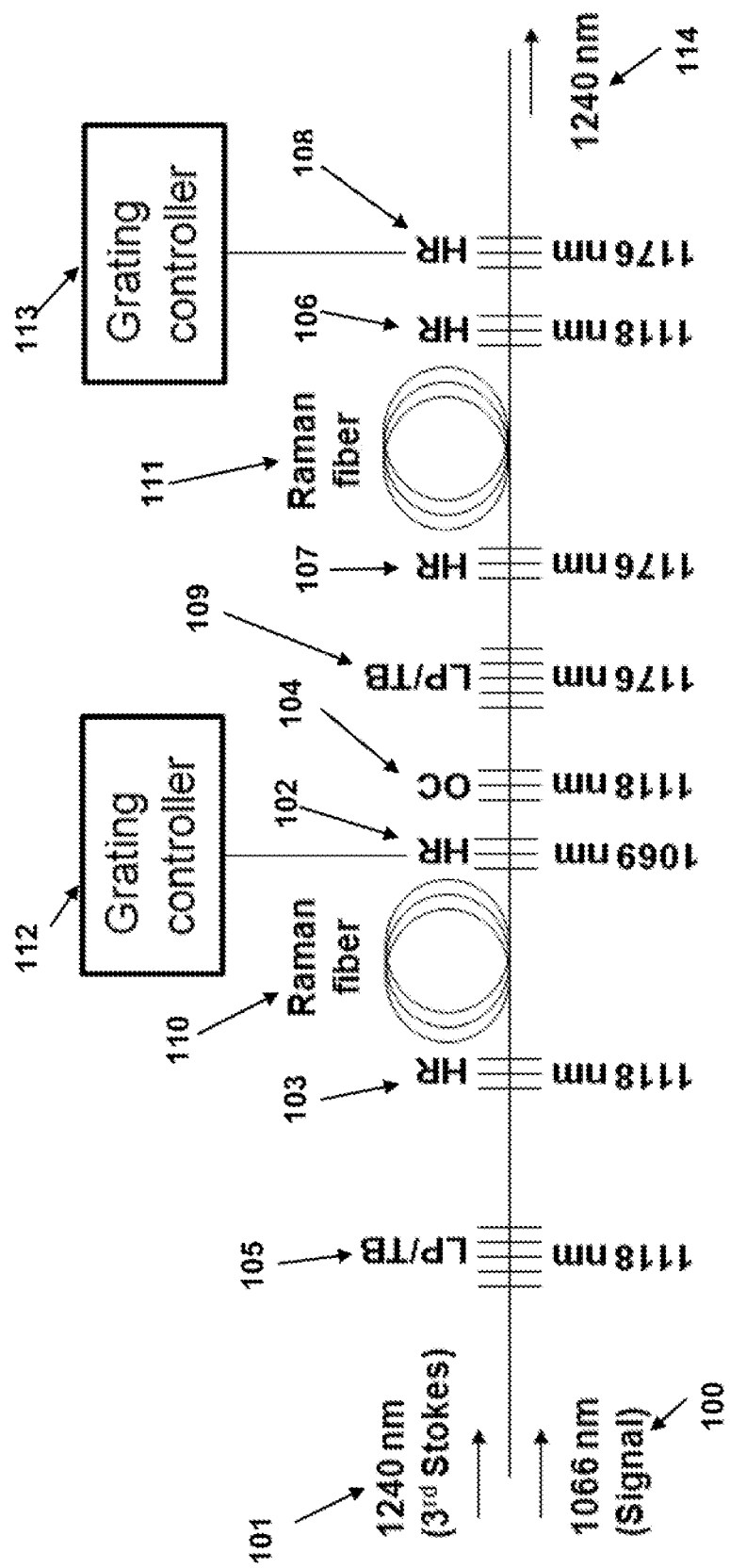
FIG. 11 is a diagram of a 1240 nm rare-earth-doped amplifier/Raman amplifier in a linear (non-nested) configuration.

Another embodiment of the system involves replacing the Raman resonators shown in the dashed box in FIG. 10 with the configuration shown in FIG. 11 where the Raman resonators are completely untested. In this embodiment, the amplified 1066 nm (zeroth-order Stokes signal) 100 and the seed for the 1240 nm (third-order Stokes line) 101 enter the Raman resonator configuration. The amplified zeroth-order Stokes signal and third-order Stokes signal are passed through a long-period grating tuned to the first Stokes line 105 and are injected into the first Raman resonator in the series. The zeroth-order Stokes signal passes through a high reflector Bragg grating tuned to the first-order Stokes line 103 into the germanosilicate Raman fiber 110. Any unused zeroth-order Stokes signal at 1066 nm is reflected back into the Raman fiber 110 by a high-reflector Bragg grating 102 set at the zeroth-order Stokes line. In this Raman resonator, defined by the high reflector Bragg grating 103 and the output coupler Bragg grating 104, the zeroth-order Stokes signal is converted to the first-order Stokes line at 1118 nm via the Raman process, Any first-order Stokes signal that leaks out of the Bragg grating 103 back toward the rare-earth-doped amplifier will be put in the cladding by the long period or tilted Bragg grating 105, where it will be absorbed. The third-order Stokes signal at 1240 nm together with the first-Stokes signal at 1118 nm, pass through a long-period grating set at the second-order Stokes line 109 prior to entering the second Raman resonator defined by the high reflector Bragg gratings 107 and 108. In this resonator, the first-order Stokes line is converted to the second-order Stokes line in the germanosilicate Raman fiber 111. Any unused first-order Stokes signal will be reflected back into the Raman fiber 111 by the high reflector Bragg grating 106. Any second-order Stokes signal which leaks out of the Bragg grating 107 back toward the rare-earth amplifier will be put into the cladding by a long period or tilted Bragg grating 109 and absorbed. Upon entering the Raman resonator tuned to 1176 nm, the 1240 nm seed (third-order Stokes signal) is amplified to high levels and output from the system 114. SBS needs to be considered for the 1240 nm only if it is narrow linewidth. Again, because of potentially low seed powers at the desired output wavelength, it may be necessary to have multiple rare-earth-doped amplifier/Raman resonator configurations in series to enable amplification of the desired output wavelength to the power levels desired. The embodiment shown in FIG. 11 is compatible with all techniques to suppress SBS to include different types of fibers, strain, multiple temperature zones, large mode area fiber, acoustically tailored fiber, etc. In addition, the embodiment is compatible with polarized and unpolarized modes of operation as well as continuous wave or pulsed operation.

To prevent significant linewidth broadening of the 1240 nm seed, one of the Bragg gratings 102 and 108 in each of the 1118 and 1176 nm resonators needs to be offset so that four wave mixing is impeded and an appropriately narrow bandwidth resonates to aid in suppression of linewidth broadening. Offset of the Bragg gratings can be accomplished using grating controllers 112 and 113 to either stretch, heat, or bend the gratings. High dispersion Raman fiber can also be used to break the phase-matching condition associated with four-wave mixing.

1300-1500 nm Laser System

Figure 12:
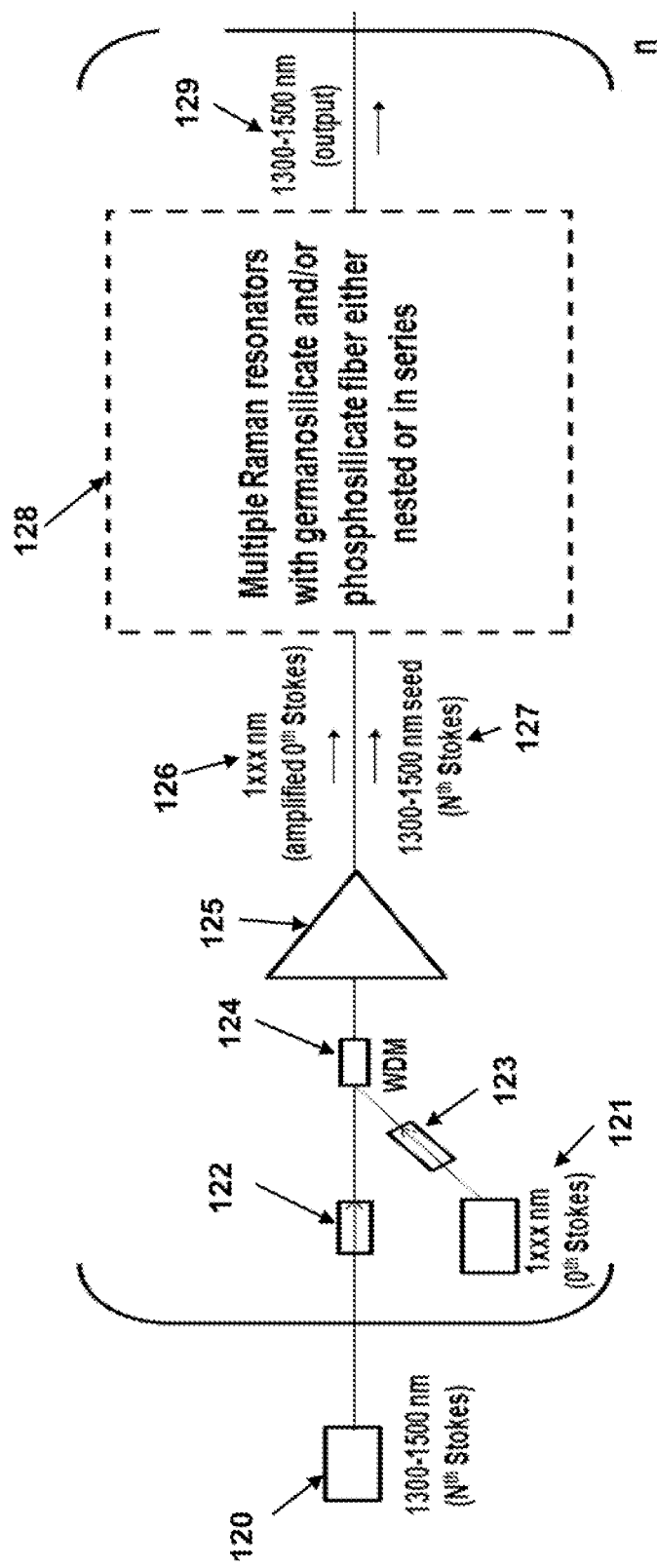
FIG. 12 is a generic diagram of a 1300-1500 nm rare-earth-doped amplifier/Raman amplifier.

The final exemplary application for the invention discussed in this patent is the creation of a series of lasers in the 1300-1500 nm spectral region for telecommunications applications. A block diagram showing a general embodiment of the system is shown in FIG. 12. To enable the desired output wavelength of the $N^{th}$ order Stokes line, the following parameters are adjustable: the input zeroth-order Stokes wavelength, the type(s) of Raman fiber used in the system, as well as the center reflectivity wavelength for the gratings. In the diagram, the first device shown is a seed 120 for the $N^{th}$ order Stokes signal having a linewidth consistent with what is required of the output. Another device in the diagram is a seed 121 for the zeroth-order Stokes signal at a wavelength appropriate to enable the desired output wavelength on the $N^{th}$ order Stokes line. The seed for the $N^{th}$ order Stokes line is passed through an isolator 122 and into a WDM 124. The zeroth-order Stokes signal 121 is passed through an isolator 123 and into the same WDM 124. Both the zeroth and $N^{th}$ order Stokes seed signals enter a rare-earth-doped amplifier 125 where the zeroth-order Stokes seed is amplified. Both the amplified zeroth-order Stokes signal and the $N^{th}$ order Stokes seed enter multiple Raman resonators 128 which may be in various configurations. Within the Raman resonator configuration, the zeroth-order Stokes signal is converted to the $N-1^{th}$ order Stokes signal in steps (zeroth order Stokes signal→ first order Stokes signal→second order Stokes signal→ . . . →$N-1^{th}$ order Stokes signal) in silica, germanosilicate, and/or phosphosilicate fibers. The seed for the $N^{th}$ order Stokes line is then amplified to a high power level by the $N-1^{th}$ order Stokes signal in a single pass through the system. The output of the system 129 is the $N^{th}$ order Stokes signal at the desired wavelength between 1300 and 1500 nm. Once again, because of potentially low seed powers at the desired output wavelength, it may be necessary to have multiple rare-earth-doped amplifier/Raman resonator configurations in series to enable amplification of the desired output wavelength to the power levels desired.

For telecommunication applications, the ability to create lasers having small shifts in wavelength to enable wavelength division multiplexing in a certain bandwidth is necessary. Small shifts in the output wavelength are achievable by adjusting the wavelength of the Nth order Stokes line, the wavelength of the zeroth-order Stokes signal and/or the center wavelength of the Bragg gratings. This embodiment is compatible with all techniques to suppress SBS to include large mode area fiber, strain, multiple temperature zones, acoustically tailored fiber, etc. In addition, the embodiment is compatible with PM as well as non-PM modes of operation in addition to continuous wave and pulsed operation.

The invention claimed is:

1. A method of generating a high-power, narrow linewidth laser signal, comprising:
   a. supplying a zeroth-order Stokes wavelength seed signal at 1069 nm having a linewidth sufficient to prevent significant Stimulated Brillouin Scattering;
   b. passing the 1069 nm Stokes signal through a first isolator and then into a wavelength division multiplexer;
   c. supplying a second-order Stokes wavelength seed signal at 1178 nm having a maximum linewidth of 10 MHz;
   d. passing the 1178 nm Stokes signal through a second isolator and then into the wavelength division multiplexer;
   e. passing the 1069 nm Stokes signal and the 1178 nm Stokes signal through the wavelength division multiplexer;
   f. injecting the 1069 nm Stokes signal and the 1178 nm Stokes signal into a rare-earth-doped amplifier to create an amplified 1069 nm Stokes signal and also output the 1178 nm Stokes signal;
   g. passing the amplified 1069 nm Stokes signal and the 1178 nm Stokes signal through a 1121 nm long period or tilted Bragg grating centered at 1121 nm; and
   h. passing the amplified 1069 nm Stokes signal and the 1178 nm Stokes signal through an 1121 nm Raman resonator comprised of
      a Raman fiber having an input end and an output end;
      a pair of reflective Bragg gratings each tuned to have a center wavelength of 1121 nm, with one of the pair of reflective Bragg gratings being located at the input end and the other being located at the output end; and
      a reflective Bragg grating tuned to 1069 nm, lying in between the pair of reflective Bragg gratings, and being located nearer to the output end than the input end, whereby
   i. the 1178 nm Stokes signal is amplified and then output through the output end of the Raman fiber as an output 1178 nm Stokes signal.

2. The method of generating a high-power, narrow linewidth laser signal as defined by claim 1, further comprising tuning one Bragg grating of the pair of reflective 1121 nm Bragg gratings of the Raman resonator to offset its center wavelength of 1121 nm, and thereby impede four-wave mixing and also control the linewidth of the 1121 nm signal.

3. The method of generating a high-power, narrow linewidth laser signal as defined by claim 1, wherein the Raman fiber is fabricated from one of a group consisting of silica, germanosilicate and phosphosilicate.

4. The method of generating a high-power, narrow linewidth laser signal as defined by claim 1, wherein:
   a. the Raman fiber is photosensitive and is a high-dispersion Raman fiber; and
   b. the rare-earth-doped amplifier has multiple stages, whereby
   c. the phase-matching condition required for four-wave mixing cannot be satisfied, thereby enabling control of the linewidth of the output 1178 nm Stokes signal.

5. The method of generating a high-power, narrow linewidth laser signal as defined by claim 1, wherein the reflective Bragg grating tuned to 1069 nm is located adjacent the output end of the Raman fiber.

6. The method of generating a high-power, narrow linewidth laser signal as defined by claim 1, wherein the output 1178 nm Stokes signal is used in a sodium guidestar laser.

7. The method of generating a high-power, narrow linewidth laser signal as defined by claim 1, further comprising mitigating Stimulated Brillouin Scattering by employing a technique selected from a group consisting of using a large mode area Raman fiber, using multiple temperature zones in the Raman fiber, straining the Raman fiber, acoustically tailoring the Raman fiber, and fabricating the Raman fiber from multiple types of fiber.

8. The method of generating a high-power, narrow linewidth laser signal as defined by claim 1, wherein the output 1178 nm Stokes signal is polarized.

9. The method of generating a high-power, narrow linewidth laser signal as defined by claim 8, wherein the output 1178 nm Stokes signal is a continuous wave.

10. The method of generating a high-power, narrow linewidth laser signal as defined by claim 8, wherein the output 1178 nm Stokes signal is pulsed.

11. The method of generating a high-power, narrow linewidth laser signal as defined by claim 1, wherein the output 1178 nm Stokes signal is nonpolarized.

12. The method of generating a high-power, narrow linewidth laser signal as defined by claim 11, wherein the output 1178 nm Stokes signal is a continuous wave.

13. The method of generating a high-power, narrow linewidth laser signal as defined by claim 11, wherein the output 1178 nm Stokes signal is pulsed.

14. A laser apparatus for generating a high-power, narrow linewidth laser signal, comprising:
   a. a signal generator for generating a zeroth-order Stokes wavelength seed signal at 1069 nm having a linewidth sufficient to prevent significant Stimulated Brillouin Scattering;
   b. a first isolator for isolating the 1069 nm Stokes signal and then injecting the 1069 nm Stokes signal into a wavelength division multiplexer;
   c. a signal generator for generating a second-order Stokes wavelength seed signal at 1178 nm having a maximum linewidth of 10 MHz;
   d. a second isolator for isolating the 1178 nm Stokes signal and then injecting the 1178 Stokes signal into the wavelength division multiplexer;
   e. the wavelength division multiplexer being for injecting the 1069 nm Stokes signal and the 1178 Stokes signal into a rare-earth-doped amplifier for amplifying the 1069 nm Stokes signal to create an amplified 1069 nm Stokes signal; and f. a 1121 nm long period or tilted Bragg grating centered at 1121 nm for receiving the amplified 1069 nm Stokes signal and the 1178 nm Stokes signal from the rare-earth-doped amplifier and subsequently injecting them into a 1121 nm Raman resonator comprised of a Raman fiber having an input end and an output end;

a pair of reflective Bragg gratings each tuned to have a center wavelength of 1121 nm, with one of the pair of reflective Bragg gratings being located at the input end and the other being located at the output end; and a reflective Bragg grating tuned to 1069 nm, lying in between the pair of reflective Bragg gratings, and being located nearer to the output end than the input end, whereby g. the 1178 nm Stokes signal is amplified and then output through the output end of the Raman fiber as an output 1178 nm Stokes signal.

15. The laser apparatus as defined by claim 14, further comprising one Bragg grating of the pair of reflective 1121 nm Bragg gratings of the Raman resonator being tuned to offset its center wavelength of 1121 nm, to thereby impede four-wave mixing and also control the linewidth of the 1121 nm signal.

16. The laser apparatus as defined by claim 14, wherein the Raman fiber is fabricated from one of a group consisting of silica, germanosilicate and phosphosilicate.

17. The laser apparatus as defined by claim 14, wherein:

a. the Raman fiber is photosensitive and is a high-dispersion Raman fiber; and b. the rare-earth-doped amplifier has multiple stages, whereby c. the phase-matching condition required for four-wave mixing cannot be satisfied, thereby enabling control of the linewidth of the output 1178 nm Stokes signal.

18. The laser apparatus as defined by claim 14, wherein the output 1178 nm Stokes signal is used in a sodium guidestar laser.

19. The laser apparatus as defined by claim 14, wherein the reflective Bragg grating tuned to 1069 nm is located adjacent the output end of the Raman fiber.

20. The laser apparatus as defined by claim 14, wherein:

the Raman fiber has a characteristic selected from a group consisting of having a large mode area, having multiple temperature zones, being strained, being acoustically tailored, and being fabricated from multiple types of fiber, whereby Stimulated Brillouin Scattering is mitigated.

21. The laser apparatus as defined by claim 14, wherein the output 1178 nm Stokes signal is pulsed.

22. The laser apparatus as defined by claim 21, wherein the output 1178 nm Stokes signal is polarized.

23. The laser apparatus as defined by claim 21, wherein the output 1178 nm Stokes signal is nonpolarized.

24. The laser apparatus as defined by claim 14, wherein the output 1178 nm Stokes signal is a continuous wave.

25. The laser apparatus as defined by claim 24, wherein the output 1178 nm Stokes signal is polarized.

26. The laser apparatus as defined by claim 24, wherein the output 1178 nm Stokes signal is nonpolarized.

* * * * *